United States Patent
Parsa et al.

(10) Patent No.: US 9,293,422 B1
(45) Date of Patent: Mar. 22, 2016

(54) OPTOELECTRONIC PACKAGES HAVING MAGNETIC FIELD CANCELATION

(71) Applicant: Texas Instruments Incorporated, Dallas, TX (US)

(72) Inventors: Roozbeh Parsa, Portola Valley, CA (US); William French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/697,792

(22) Filed: Apr. 28, 2015

Related U.S. Application Data

(60) Provisional application No. 62/055,827, filed on Sep. 26, 2014.

(51) Int. Cl.
- H01L 23/495 (2006.01)
- H01L 21/00 (2006.01)
- H01L 23/552 (2006.01)
- H01L 25/16 (2006.01)
- H01L 23/00 (2006.01)
- H01L 31/0232 (2014.01)
- H01L 31/109 (2006.01)

(52) U.S. Cl.
CPC .............. *H01L 23/552* (2013.01); *H01L 24/49* (2013.01); *H01L 25/162* (2013.01); *H01L 25/167* (2013.01); *H01L 31/02327* (2013.01); *H01L 31/109* (2013.01); *H01L 2224/17181* (2013.01)

(58) Field of Classification Search
CPC .... H01L 23/552; H01L 25/167; H01L 31/109
USPC .............................................. 257/675; 438/24
See application file for complete search history.

(56) References Cited

U.S. PATENT DOCUMENTS

| | | | |
|---|---|---|---|
| 6,888,374 B2 | 5/2005 | Bal | |
| 7,160,478 B2 * | 1/2007 | Leib | H01L 27/14618 216/13 |
| 2013/0075761 A1 * | 3/2013 | Akiyama | H01L 27/288 257/80 |
| 2014/0087495 A1 * | 3/2014 | Lee | H01L 27/3269 438/24 |
| 2015/0028866 A1 | 1/2015 | Parsa et al. | |
| 2015/0282273 A1 * | 10/2015 | Ingle | H01L 51/529 315/309 |

* cited by examiner

*Primary Examiner* — David S Blum
(74) *Attorney, Agent, or Firm* — Jacqueline J. Garner; Frank D. Cimino

(57) ABSTRACT

A stacked optoelectronic packaged device includes a bottom die having a top surface including bottom electrical traces and a light source die coupled to ≥1 bottom electrical traces. A first cavity die is on the bottom die. An optics die is on the first cavity die and a second cavity die on the optics die. A mounting substrate is on the second cavity die including top electrical traces. A photodetector die is optically coupled to receive light from the light source. The bottom and top electrical traces are both positioned substantially symmetrically on sides of a mirror plane so that when conducting equal and opposite currents a first magnetic field emanating from the first side and a second magnetic field emanating from the second side cancel one another to provide a reduction in magnetic flux density by more than 50% at one or more die locations on the optics die.

14 Claims, 4 Drawing Sheets

OPTOELECTRONIC PACKAGES HAVING MAGNETIC FIELD CANCELATION

CROSS REFERENCE TO RELATED APPLICATIONS

This application claims the benefit of Provisional Application Ser. No. 62/055,827 entitled "Microfabricated atomic clocks (MFAC) & magnetometers (MFAM): high volume manufactural (HVM) magnetic characterization" filed Sep. 26, 2014, which is herein incorporated by reference in its entirety.

FIELD

Disclosed embodiments relate to stacked optoelectronic packages implementing optically pumped sensors or references, such as MFACs and MFAMs.

BACKGROUND

A variety of optoelectronic devices are packaged devices which include a photodetector (PD) and at least one light source that is operated under a vacuum. Conventional MFAC and MFAM packages include a vertically stacked structure inside a package material including a bottom die as a support having electrical traces and at least one light source die (e.g., a laser die such as a vertical-cavity surface-emitting laser (VCSEL)) mounted thereon, a first cavity die on the bottom die providing a cavity over the light source, and an optics die on the first cavity die.

The electrical traces on the bottom die connect an external driver which drives the light source and includes traces configured for a resistive heater element, such as to provide heat to heat the light source die to a temperature of about 60° C. to 80° C. A second cavity die is on the optics die, other optical device(s) (e.g., a polarizer) is on the second cavity die, and a photodetector (PD) die is on a dielectric substrate over the other optical device(s). The package is a vacuum sealed package.

SUMMARY

This Summary is provided to introduce a brief selection of disclosed concepts in a simplified form that are further described below in the Detailed Description including the drawings provided. This Summary is not intended to limit the claimed subject matter's scope.

A stacked optoelectronic package includes a bottom die having a top surface including bottom electrical traces, and a light source die coupled to ≥1 bottom electrical traces. A first cavity die is on the bottom die. An optics die is on the first cavity die and a second cavity die is on the optics die. A second mounting substrate is on the second cavity die including top electrical traces thereon. A photodetector die is optically coupled to receive light from the light source. The bottom and top electrical traces are both positioned on the XY plane surface substantially symmetrically on sides of a XZ mirror plane so that when oppositely biased conduct equal and opposite currents so that a first magnetic field emanating from the first side and a second magnetic field emanating from the second side in the Z-direction cancel one another to provide a reduction in magnetic flux density by more than 50% at one or more die locations on the optics die.

BRIEF DESCRIPTION OF THE DRAWINGS

Reference will now be made to the accompanying drawings, which are not necessarily drawn to scale, wherein.

DETAILED DESCRIPTION

Figure 1A:
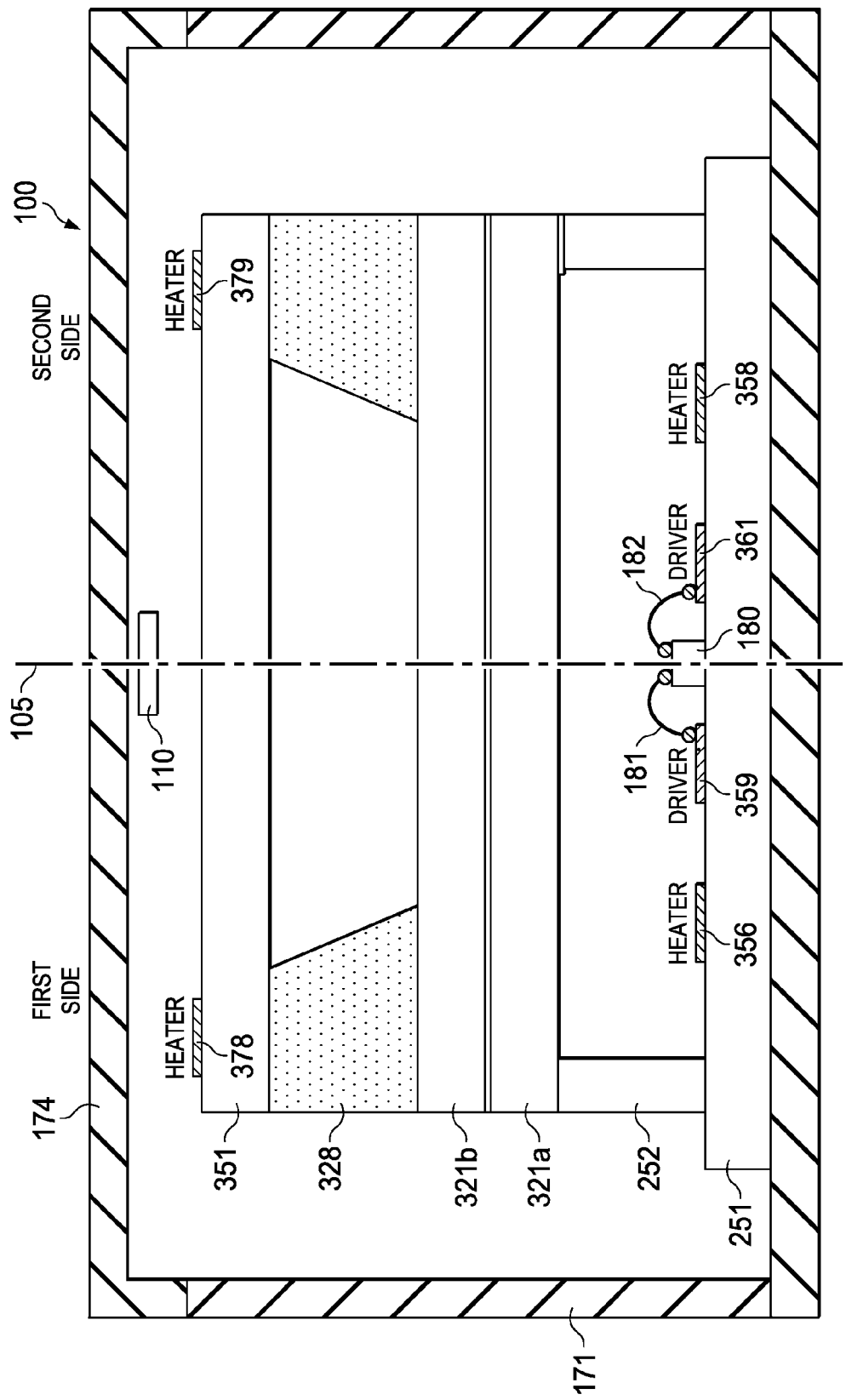
FIG. 1A is a cross sectional depiction of an example stacked optoelectronic packaged device having at least substantially symmetric placement of electrical traces on opposing sides of a mirror plane for both a second mounting substrate above and bottom die below the optics die in the package, so that when the traces are oppositely biased they conduct equal and opposite currents on respective sides of the mirror plane to provide magnetic field cancelation and thus noise reduction for the optics die, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

For stacked optoelectronic packages such as micro-fabricated atomic clocks (MFAC), and magnetometers (MFAM), and motion sensor devices, during operation current flowing in electrical traces for the heater and driver for the light source, and heater for the upper cavity over the light source generally containing alkali metal vapor is recognized to result in magnetic field-induced noise (electromagnetic interference, EMI) which can significantly degrade the performance of the device, such as the sensitivity. Disclosed embodiments include optoelectronic packages minimizing the magnetic field introduced in the Z-(height) including along the optics die surface provided by at least substantially symmetric placement of electrical traces on opposing sides of a mirror plane for a die/substrate both above and die/substrate below the optics die in the package. When oppositely biased equal and opposite currents are provided on respective sides of the mirror plane, this arrangement is recognized to provide magnetic field cancelation on the optics die and thus noise reduction.

FIG. 1A is a cross sectional depiction of an example stacked optoelectronic packaged device (packaged device) 100 having at least substantially symmetric placement of electrical traces on opposing sides of an XZ mirror plane (mirror plane) 105 for both the second mounting substrate 351 above and bottom die 251 below the optics die 321a in the package so that when oppositely biased conduct equal and opposite currents to provide magnetic field cancelation and thus noise reduction for the optics die 321a, according to an example embodiment. Although not shown in FIGS. 1A and 1B, each electrical trace includes bond pads generally on the perimeter (edge) of the die or substrate to allow electrical connections thereto (see FIG. 2 described below). Traces generally comprise a metal or a metal alloy, such as aluminum or platinum.

As one moves a distance (z) the Z-direction above or below a current conducting trace on an XY plane, it is known the magnetic field intensity falls off as 1/z. Disclosed embodiments recognize when electrical traces on an XY plane are positioned substantially symmetrically with respect to sides of a mirror plane such a mirror plane 105 and are oppositely biased to have current for electrical traces on one side of the mirror plane flowing in an equal magnitude and in an opposite direction with respect to current flowing for the electrical traces on the other side of the mirror plane, the magnetic flux density at a distance z in the Z-direction above or below the XY plane between the respective electrical traces due to magnetic field cancelation of magnetic fields emanating from the respective sides can largely be canceled (and thus reduced).

Figure 2:
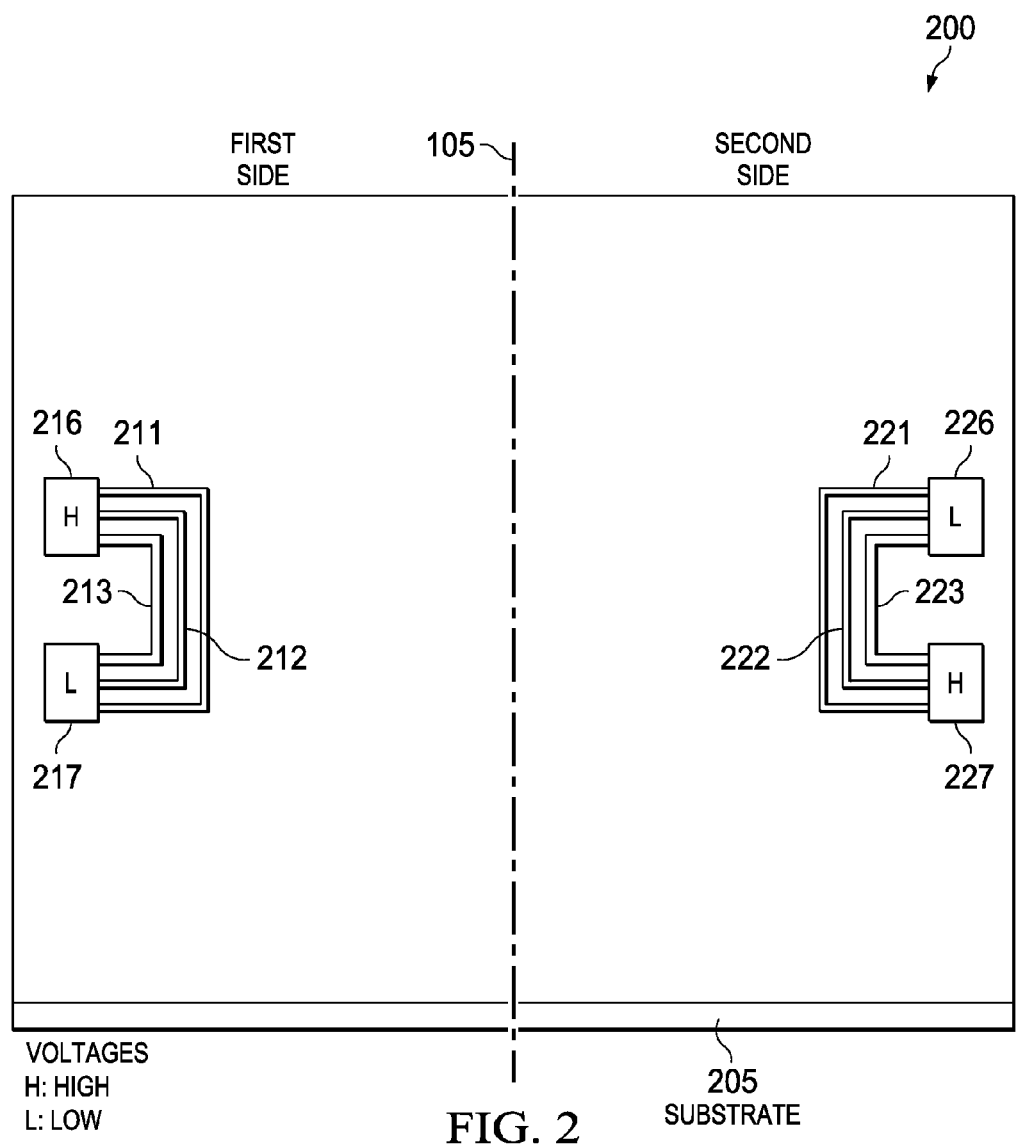
FIG. 2 is a depiction of an example die having substantially symmetric placement of first and second electrical traces on the surface of at least one die so that when oppositely biased conduct equal and opposite currents provide magnetic field cancelation in the Z-direction, according to an example embodiment.

Packaged device 100 includes a plurality of stacked components within a package comprising a package material having a package body 171 providing side walls and a bottom wall for the package, and a lid 174 for sealing a top of the package. The plurality of stacked components include bottom die 251 on the bottom wall of the package having a top surface including a plurality of bottom electrical traces shown as driver traces 359 and 361, and heater traces 356 and 358, which each implement a resistive heating element, and a light source die 180 for emitting light coupled to driver traces 359 and 361 which provide electrical bias to the electrodes of the light source die 180 through bond wires 181 and 182 respectively. An example heater trace arrangement is shown in FIG. 2 described below.

A first cavity die 252 having a top surface and a bottom surface is on the top surface of the bottom die 251. The optics die 321a is on the top surface of the first cavity die 252, and a optically transparent sealing or die sheet (sealing die, for cavity sealing) 321b is on the optics die 321a. A second cavity die 328 on the sealing die 321b.

The second mounting substrate 351 has a top surface including a plurality of top electrical traces shown as heater traces 378 and 379 which each implement a resistive heating element. A photodetector (PD) die 110 is optically coupled to receive the light originating from the light source 180, shown in FIG. 1A being in a line-of-sight location.

The mirror plane 105 is shown in FIG. 1A oriented orthogonal to the various die of the packaged device 100 which are all oriented along the XY plane. Driver trace 359, heater trace 356, and heater trace 378 are all shown on the first side of the mirror plane 105, while driver trace 361, heater trace 358 and heater trace 379 are all on the second side of the mirror plane 105. Accordingly, when oppositely biased by a power supply to conduct equal and opposite currents in driver traces 359 and 361, heater traces 356 and 358, and heater traces 378 and 379, a first magnetic field emanating from the first side of the mirror plane 105 and a second magnetic field emanating from the second side of the mirror plane 105 cancel one another to provide a reduction in magnetic flux density by more than 50% at one or more die locations on the optics die 321a.

For example, assume during operation at the center of the optics die the first magnetic flux density B emanating from the first side is x Newton-meters per ampere (Nm/A) or tesla (T), and the second magnetic flux density B emanating from the second side is 0.9×T. A 50% reduction in magnetic flux density means the net B at the center of the optics die is less than 0.5 T. As noted above, the magnetic field cancelation provides noise reduction for the optics die 321a leading to improved performance for the packaged device 100.

Figure 1B:
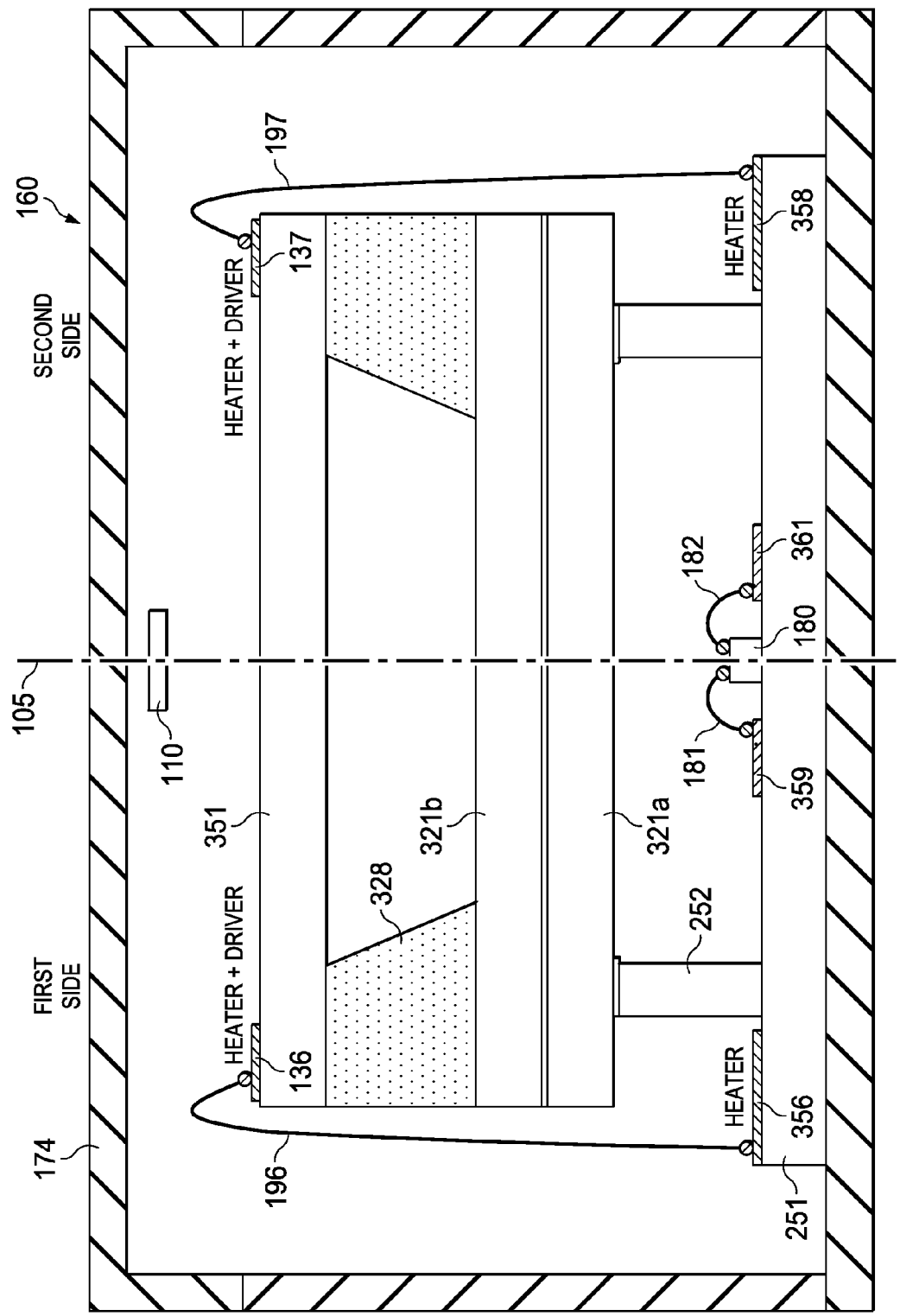
FIG. 1B is a cross sectional depiction of an example stacked optoelectronic packaged device having substantially symmetric electrical trace arrangements on two different trace comprising levels so that when oppositely biased to conduct equal and opposite currents both provide magnetic field cancelation, along with bond wires shown for shorting electrical traces on the second mounting substrate and electrical traces on the bottom die for each side, according to an example embodiment.

FIG. 1B is a cross sectional depiction of an example stacked optoelectronic packaged device 160 having at least substantially symmetric placement of electrical traces on opposing sides of a mirror plane 105 for both the second mounting substrate 351 above and bottom die 251 below the optics die 321a in the package, so that when biased oppositely on respective sides of the mirror plane 105 provide magnetic field cancelation and thus noise reduction for the optics die 321a, according to an example embodiment. Electrical trace 136 is on the first side and electrical trace 137 is on the second side of the second mounting substrate 351, and electrical trace 359 and heater trace 356 is on the first side and electrical trace 361 and heater trace 358 are on the second side of the bottom die 251.

Electrical traces 136, 137 are labeled "heater+driver" as they can provide routing for heating elements that also enables an RF signal to be added on top of the DC heating signal in order to generate an internal magnetic field in applications such as MFAC where the second cavity die 328 needs to be placed within a known magnetic field. Electrical traces 359 and 361 are separate traces for biasing the light source 180 from an external driver source to bond pads of the light source 180.

Bond wires 196 and 197 are included for shorting between the heater trace 356 on the bottom die 251 and the electrical trace 136 on the second mounting substrate 351, and between heater trace 358 on the bottom die 251 and the electrical trace 137 on the second mounting substrate 351. Bond wires 196 and 197 also provide an essentially full loop around the device for both canceling the magnetic field in the second cavity with a single pair of bias signals, and as noted above also optionally applying a RF signal if needed through an applied RF bias to electrical traces 136, 137. This arrangement can be compared to known approaches that have electrically isolated separate traces for top and bottom heating elements.

FIG. 2 is a depiction of an example die 200 comprising a substrate 205 having a simplified example of substantially symmetric placement of electrical traces on opposing first and second sides of a mirror plane 105 so that when oppositely biased to provide equal and opposite currents on respective sides of the mirror plane 105 provide magnetic field cancelation in the Z-direction above or below, according to an example embodiment. As shown, on the first side there are electrical traces 211, 212 and 213, and bond pads 216 and 217, and on the second side there are electrical traces 221, 222 and 223, and bond pads 226 and 227. The electrical traces 211, 212 and 213 and electrical traces 221, 222 and 223 can be seen to be mirror images of one another about the mirror plane 105. The electrical traces 211, 212 and 213 can provide a first heating element, and electrical traces 221, 222 and 223 can provide a second heating element, such as for providing heater traces 378 and 379 on the second mounting substrate 351 shown in FIG. 1A.

Bond pads 216 and 227 are labeled in FIG. 2 as high (H) voltage bond pads and bond pads 217 and 226 are labeled as low (L) voltage bond pads. For example, applying 5 V to bond pads 216 and 227 and bond pads 217 and 226 as grounds can be used for heating while providing magnetic field cancelation in the Z-direction above or below substrate 205 in the region between electrical traces 211, 212 and 213 and electrical traces 221, 222 and 223.

The width of the respective traces is shown in FIG. 2 reduced as one gets closer to the center of the die 200, with trace 213 wider than traces 211 and 212, and trace 223 wider than traces 221 and 222. This arrangement results in less current flowing through the traces close to the center of the die causing less magnetic field generated and thus less noise generated into the middle of second cavity die 328.

Figure 3:
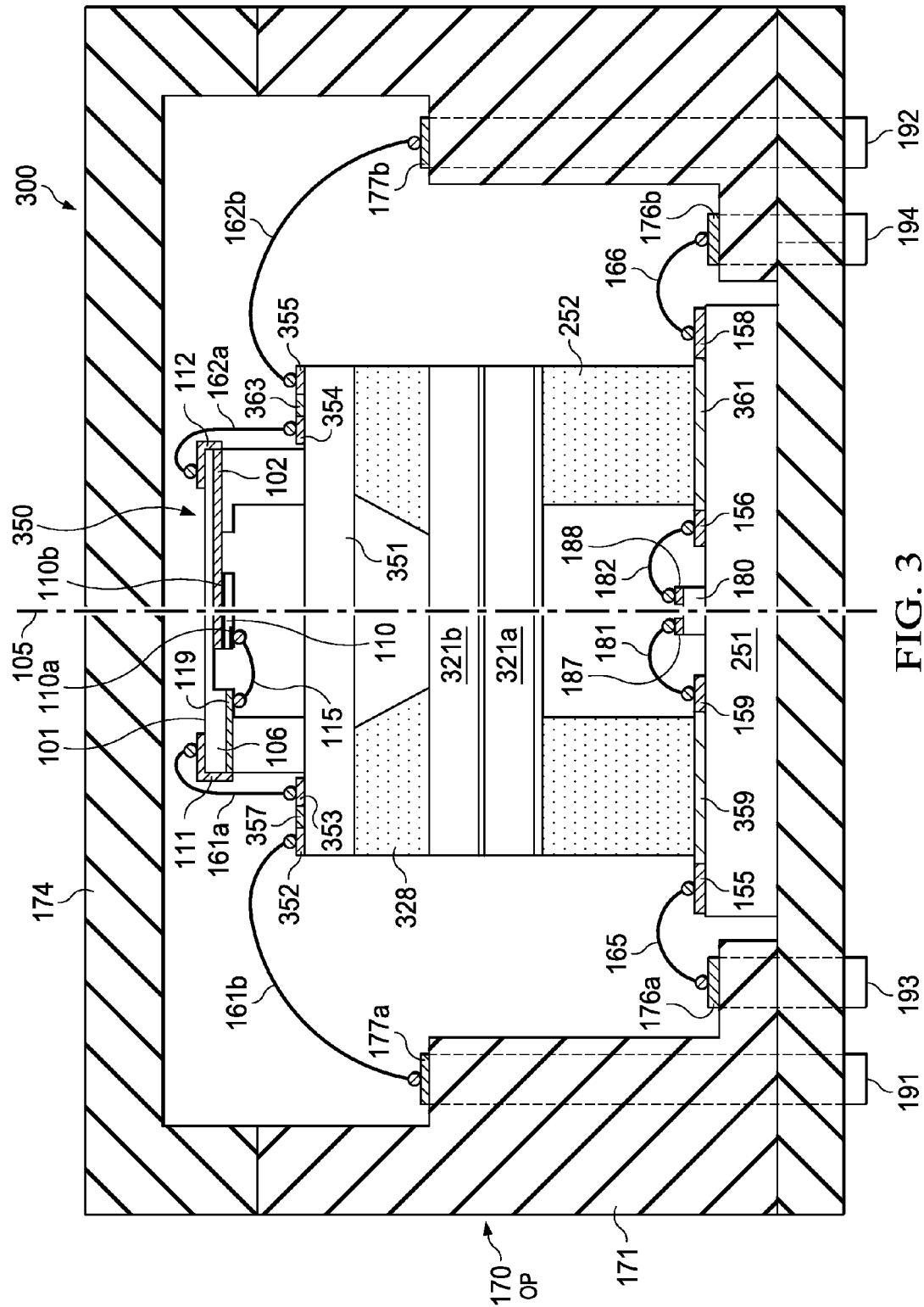
FIG. 3 is an example packaged stacked optoelectronic device including disclosed substantially symmetric placement of first and second electrical traces on the surface of the die so that when oppositely biased conduct equal and opposite currents to provide magnetic field cancelation in the Z-direction, according to an example embodiment.

FIG. 3 is an example packaged stacked optoelectronic device (packaged optoelectronic device) 300 including disclosed substantially symmetric placement of first and second electrical traces on the surface of at least one die in the package so that when oppositely biased to conduct equal and opposite currents provide magnetic field cancelation in the Z-direction, according to an example embodiment. Packaged optoelectronic device 300 includes a first cavity die 252 on a bottom die 251 having an electrical trace 359 with associated bond pads 155 and 159 and an electrical trace 361 with associated bond pads 156 and 158 on its top surface. Although not shown, there can be a pair of symmetrically placed heater traces on the bottom die 251 analogous to heater traces 356 and 358 shown in FIG. 1A. The second mounting substrate 351 includes bond pads 352 and 353 coupled together by the metal trace shown as 357, and bond pads 354 and 355 coupled together by the metal trace 358 shown. Electrical traces 359 and 361 are positioned substantially symmetric on respective sides of mirror plane 105, as are electrical traces 357 and 358.

Packaged optoelectronic package 300 is shown including an inner package 350 inside an outer package (OP) 170. The inner package 350 has an open top opposite its base portion that faces the bottom wall of the package.

The PD die 110 includes a first contact comprising a front contact 110a connected to a first external bond pad (FEBP) 111 by routing comprising an internal bond wire 115. The PD die 110 also includes a second contact comprising a back contact 110b connected by routing comprising a back side metal layer 102 to a second external bond pad (SEBP) 112.

The inner package 350 shown includes a multi-layer first dielectric substrate including a first dielectric level 101, and a second dielectric level 106 above the first dielectric level 101. As known in the art, the multi-layer first dielectric substrate can be an integral (one-piece) substrate so that the first dielectric level 101 and second dielectric level 106, together with any intervening metal layer, are configured without the need for any adhesive. For example, ceramic packages have build-up layers that allow integrated metal connections laterally and vertically to the reach the outer surface of the package.

The first dielectric level 101 includes a top side including a first die attach area having back side metal layer 102 thereon extending to a first outer edge of the inner package 350, and the FEBP 111 and SEBP 112 extend over a portion of a bottom side of the first dielectric level 101. The second dielectric level 106 is above the first dielectric level 101 framing the die attach area including a wire bonding area having a second metal layer 119 extending to the second outer edge of the inner package 350.

The front contact 110a can comprise bond pad metal connected to an n+ region and the back contact 110b can comprise bond pad metal connected to a p+ region. The back contact 110b can be the entire bottom side of the PD die 110. The internal bond wire 115 connects the front contact 110a to the second metal layer 119.

The PD die 110 can comprise any suitable front-side illuminated PD including a photodiode, a phototransistor or a charge-coupled device (CCD), which all can be off-the-shelf PD die. In one embodiment the PD die 110 includes a first active layer having a first conductivity (e.g., n+), a second active layer having a second conductivity (e.g., p+) opposite the first conductivity, and an intrinsic layer separating the first and second active layers (to form a PIN diode).

The inner package 350 is on the second mounting substrate 351. Bond wire 161a connects the FEBP 111 to bond pad 353 and bond wire 161b connects the bond pad 352 to upper wire bond area 177a. Bond wire 162a connects the SEBP 112 to bond pad 354 and bond wire 162b connects bond pad 355 to upper wire bond area 177b.

First bond wires shown as bond wire 161a and bond wire 161b together connect the FEBP 111 to the wire bond area 177a which connects the first terminal 191 of the OP 170, second bonds wires 162a and 162b together connect the SEBP 112 to the wire bond area 177b which connects to the second terminal 192 of the OP 170, a third bond wire 165 connects bond pad 155 at the end of metal trace 359 to a lower bond pad 176a which through metal trace 359 and the bond wire between bond pad 159 and first electrode 181 connects to the first electrode 181 to the third terminal 193 of the OP 170, and a fourth bond wire 166 from bond pad 158 to a lower bond pad 176b which through a wire bond from the bond pad 156 at the end of the metal trace 361 connects the second electrode 182 to a third terminal 194 of the OP 170. The lid 174 hermetically seals the OP 170.

Packaged optoelectronic package 300 includes a light source die 180 having electrodes 181 and 182 to allow biasing (e.g., electrically pumping) shown in FIG. 3 provided by third bond wire 165 from lower bond pad area 176a (connected to third terminal 193) and by fourth bond wire 166 from lower bond pad area 176b (connected to third terminal 194). Light source die 180 can comprise a VCSEL in one specific embodiment. An optically transparent sealing or die sheet (sealing die) 321b on an optics die 321a is shown between the first cavity die 252 and second cavity die 328. The sealing die 321b can comprise an optical glass which seals the lower end of the upper cavity defined by the second cavity die 328 that is sealed on the upper end by the second mounting substrate 351. The optics die 321a can comprise an optical filter or polarizer. The second mounting substrate 351 comprise an optical glass, such as a borosilicate glass, for example BOROFLOAT 33.

Disclosed embodiments being wafer/die level processed provide low cost, high throughput manufacturing, and by virtue of disclosed substantially symmetric placement of electrical traces provide low noise performance for the packaged optoelectronic device. Applications for disclosed embodiments generally include all applications having a light source such as a laser diode along with an inbuilt monitor photodetector. One specific example is a magnetometer physics package. Other examples include an atomic clock, and a motion sensor device.

Disclosed embodiments can be integrated into a variety of assembly flows to form a variety of different optoelectronic devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A stacked optoelectronic packaged device (packaged device), comprising:
a plurality of stacked components within a package comprising a package material having a package body providing side walls and a bottom wall for said package, and a lid for sealing a top of said package, said plurality of stacked components including:
a bottom die on said bottom wall having a top surface including a plurality of bottom electrical traces and a light source die for emitting light coupled to at least one of said plurality of bottom electrical traces;
a first cavity die having a top surface and a bottom surface on said top surface of said bottom die;
at least one optics die on said top surface of said first cavity die;
a second cavity die on said optics die;
a second mounting substrate on said second cavity die having a top surface including a plurality of top electrical traces, and
a photodetector (PD) die optically coupled to receive said light originating from said light source die,
wherein said plurality of bottom electrical traces and said plurality of top electrical traces are both positioned substantially symmetrically on a first side and a second side of a bottom mirror plane and a top mirror plane, respectively, so that when conducting equal and opposite currents a first magnetic field emanating from said first side and a second magnetic field emanating from said second side cancel one another to provide a reduction in magnetic flux density by more than 50% at one or more die locations on said optics die.

2. The packaged device of claim 1, wherein said plurality of bottom electrical traces provide mirror images about said bottom mirror plane and said plurality of top electrical traces provide mirror images about said top mirror plane.

3. The packaged device of claim 1, wherein said optics die comprises a polarizer.

4. The packaged device of claim 1, wherein said plurality of bottom electrical traces provide a first heater trace and a separate first driver trace on said first side and a second driver trace and a separate second heater trace on said second side.

5. The packaged device of claim 4, further comprising a first bond wire shorting said first heater trace to a first one of said plurality of top electrical traces on said first side and a second bond wire shorting said second heater trace to a second one of said plurality of top electrical traces on said second side.

6. The packaged device of claim 1, wherein said first cavity die comprises glass.

7. The packaged device of claim 1, wherein said first cavity die comprises silicon.

8. The packaged device of claim 1, wherein said PD die is mounted on a base portion of an inner package that is inside said package, wherein said inner package has an open top opposite said base portion that faces said bottom wall of said package.

9. A method, comprising:
providing a stacked optoelectronic packaged device (packaged device) including a plurality of stacked components including a bottom die on a bottom wall having a top surface including a plurality of bottom electrical traces and a light source die for emitting light coupled to at least one of said plurality of bottom electrical traces, a first cavity die having a top surface and a bottom surface on said top surface of said bottom die, an optics die on said top surface of said first cavity die, a second cavity die on said optics die, a second mounting substrate on said second cavity die having a top surface including a plurality of top electrical traces, and a photodetector (PD) die optically coupled to receive said light originating from said light source die, wherein said plurality of bottom electrical traces and said plurality of top electrical traces are both positioned substantially symmetrically on a first side and a second side of a bottom mirror plane and a top mirror plane, respectively, and
oppositely biasing said plurality of bottom electrical traces to conduct respective currents on said first and said second sides flowing in opposite directions and oppositely biasing said plurality of top electrical traces on said first side and said second side to conduct said respective currents flowing in opposite directions,
wherein a first magnetic field emanating from said first side and a second magnetic field emanating from said second side for both said plurality of bottom electrical traces and said plurality of top electrical traces cancel one another at one or more die locations on said optics die to provide a reduction in magnetic flux density by more than 50% at said die location.

10. The method of claim 9, wherein said plurality of bottom electrical traces provide mirror images about said bottom mirror plane and said plurality of top electrical traces provide mirror images about said top mirror plane.

11. The method of claim 9, wherein said optics die comprises a polarizer.

12. The method of claim 9, wherein said plurality of bottom electrical traces provide a first heater trace and a separate first driver trace on said first side and a second driver trace and a separate second heater trace on said second side, and wherein said first heater trace is shorted to a first one of said plurality of top electrical traces on said first side and said second heater trace is shorted to a second one of said plurality of top electrical traces on said second side.

13. The method of claim 12, wherein said oppositely biasing comprises applying a DC signal and an RF signal on top of said DC signal applied to said first heater trace and said first one of said plurality of top electrical traces with respect to said second heater trace and said second one of said plurality of top electrical traces, and a separate bias signal applied between said first driver trace and said second driver trace.

14. The method of claim 9, wherein said PD die is mounted on a base portion of an inner package that is inside said packaged device, said inner package having an open top opposite said base portion that faces said bottom wall of said package.

\* \* \* \* \*